United States Patent
Dias

(10) Patent No.: US 10,458,048 B2
(45) Date of Patent: Oct. 29, 2019

(54) METHOD FOR MANUFACTURING AN ELECTRONIC STRIP YARN

(71) Applicant: NOTTINGHAM TRENT UNIVERSITY, Nottingham Nottinghamshire (GB)

(72) Inventor: Tilak Kithsiri Dias, Nottingham (GB)

(73) Assignee: NOTTINGHAM TRENT UNIVERSITY, Nottingham (GB)

( * ) Notice: Subject to any disclaimer, the term of this patent is extended or adjusted under 35 U.S.C. 154(b) by 0 days.

(21) Appl. No.: 16/066,715

(22) PCT Filed: Dec. 23, 2016

(86) PCT No.: PCT/GB2016/054061
§ 371 (c)(1),
(2) Date: Jun. 28, 2018

(87) PCT Pub. No.: WO2017/115083
PCT Pub. Date: Jul. 6, 2017

(65) Prior Publication Data
US 2019/0003084 A1    Jan. 3, 2019

(30) Foreign Application Priority Data
Dec. 30, 2015 (GB) .................... 1523093.1

(51) Int. Cl.
*H05K 3/30* (2006.01)
*D02G 3/44* (2006.01)
(Continued)

(52) U.S. Cl.
CPC ............ *D02G 3/441* (2013.01); *G06K 19/027* (2013.01); *H05K 1/189* (2013.01);
(Continued)

(58) Field of Classification Search
CPC ............ D02G 3/02; D02G 3/04; D02G 3/045; D02G 3/06; D02G 3/12; D02G 3/22;
(Continued)

(56) References Cited

U.S. PATENT DOCUMENTS 6,140,146 A    10/2000  Brady et al.
6,555,755 B1 *  4/2003  Yanagisawa ........ H01L 23/4985
                                                            174/254
(Continued)

FOREIGN PATENT DOCUMENTS

GB    2472026    1/2011
WO    2011001323    1/2011

OTHER PUBLICATIONS

International Preliminary Report on Patentability and Written Opinion dated Jul. 12, 2018.

*Primary Examiner* — Paul D Kim
(74) *Attorney, Agent, or Firm* — DeWitt LLP; Thomas J. Nikolai

(57) ABSTRACT

Electronic devices (4, 24) are mounted in sequence or series along a plurality of laterally spaced discrete lines (10) on a sheet of non-conductive flexible planar support material (50). The sheet is slit or stripped between said lines to create at least two yarns each in the form of a strip bearing a series of said devices. The width of each strip can be substantially the same as that of the mounted device or devices and is normally less than twice that of the device or devices. The thickness of the support material is normally no more than 10 μm, and with the width of the devices typically being no more than 800 nm, a strip bearing the devices can thus be used as a yarn or strip for use in many applications, both functional and decorative, either alone or within a sleeve.

12 Claims, 3 Drawing Sheets

(51) Int. Cl.
*G06K 19/02* (2006.01)
*H05K 1/18* (2006.01)

(52) U.S. Cl.
CPC .. *D10B 2401/18* (2013.01); *H05K 2201/0145* (2013.01); *H05K 2201/0909* (2013.01); *H05K 2203/1545* (2013.01)

(58) Field of Classification Search
CPC ........... D02G 3/36; D02G 3/362; D02G 3/38; D02G 3/40; D02G 3/44; D02G 3/441; D10B 2401/18; G06K 19/02; H05K 1/189
See application file for complete search history.

(56) References Cited

U.S. PATENT DOCUMENTS

| | | | |
|---|---|---|---|
| 7,070,114 B2* | 7/2006 | Cho | G06K 19/07749 235/375 |
| 7,073,712 B2* | 7/2006 | Jusas | G06K 5/02 235/375 |
| 8,430,324 B2* | 4/2013 | Baba | G06K 19/07718 235/380 |
| 8,912,907 B2* | 12/2014 | Gengel | G06K 19/027 235/492 |
| 9,897,292 B1* | 2/2018 | Lindblad | F21V 19/0015 |
| 10,169,698 B1* | 1/2019 | Lindblad | G06K 19/0776 |
| 10,207,020 B2* | 2/2019 | Hofer | A61L 15/46 |
| 2004/0009729 A1 | 1/2004 | Hill et al. | |
| 2004/0188531 A1 | 9/2004 | Gengel et al. | |
| 2011/0001323 A1 | 1/2011 | Douglas et al. | |
| 2015/0003083 A1* | 1/2015 | Uehara | H05K 1/056 362/418 |

* cited by examiner

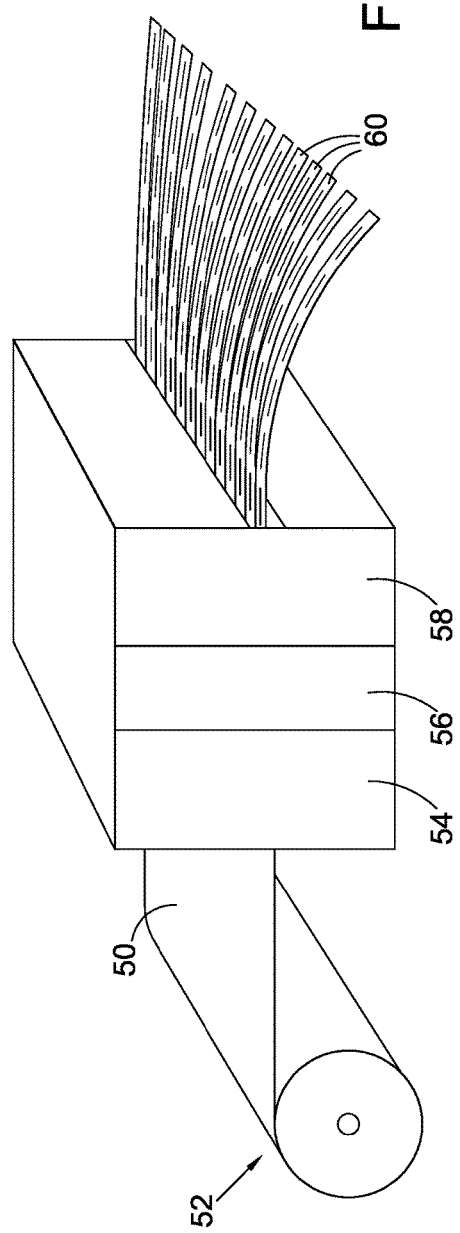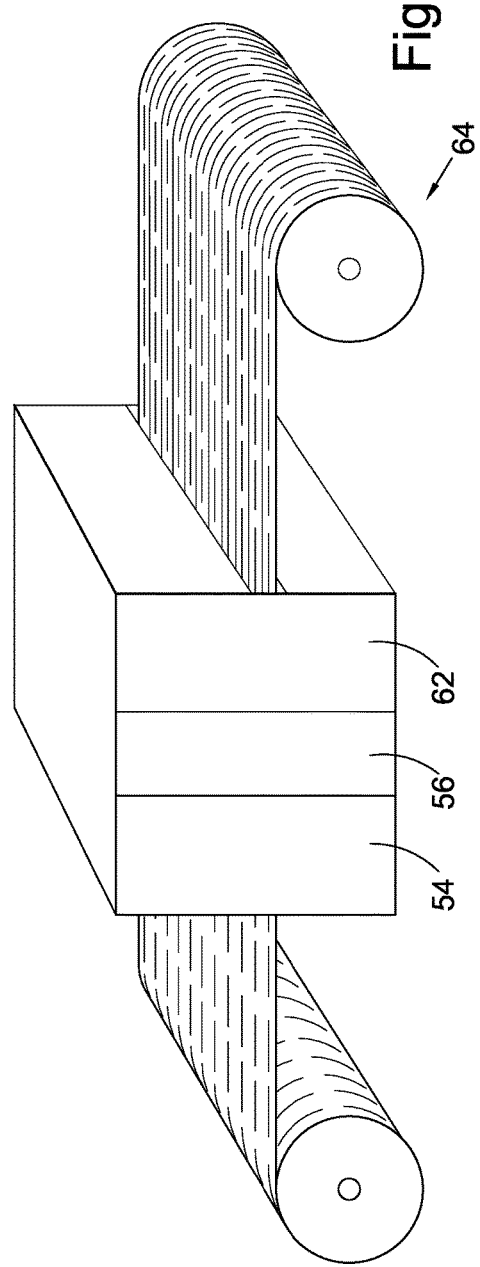

METHOD FOR MANUFACTURING AN ELECTRONIC STRIP YARN

CROSS-REFERENCED TO RELATED APPLICATIONS

This application claims priority from Application PCT/GB2016/054061, filed Dec. 23, 2016, which is deemed incorporated by reference in its entirety in this application.

STATEMENT REGARDING FEDERALLY SPONSORED RESEARCH OR DEVELOPMENT

Not applicable.

BACKGROUND OF THE INVENTION

I. Field of the Invention

This invention relates to the manufacture of yarns incorporating electronic devices. It has particular application to such yarns in which the devices and electrical connections thereto are protected. A preferred use of the yarns is incorporation into fabric products for example, although other uses are contemplated.

II. Discussion of the Prior Art

International Patent Publication Nos. WO2006/123133 and WO2011/010093, the contents whereof are hereby incorporated by reference, disclose multi-filament yarns including an operative devices confined between the yarn filaments, and a method for its manufacture. The filaments of the yarns disclosed may be textile fibres such as polyester, polyethylene, polypropylene or polyamide. One or more of the yarn filaments could be electrically conductive and coupled to a confined device to form an electrical connection thereto. These filaments can be fine metal filament wires or in the form of a polymeric monofilament yarn plated with a thin film of either copper, nickel, gold or silver. The device or devices may take any of various forms, such as a silicone chip, a ferro-magnetic polymeric chip or a phase change chip.

Reference is also directed to Japanese Patent specification No. 2013189718A and US Patent publication No. 2013/092742, the disclosures whereof are hereby incorporated. Both describe yarns carrying electronic devices within a protective outer layer or sheath. Yarns of the above International Publication are effective and can be used in fabric products. However, where the device has an electrical connection the connection will be exposed on the yarn surface and thereby compromised by contact with other yarns or elements, or by external conditions. The Japanese and US references go some way towards addressing this issue, but do not provide a resolution.

In our International Patent Application published under No. WO2016/038342 (hereinafter referred to as "our International Application"), the disclosure whereof is also hereby incorporated by reference we disclose an electronically functional yarn comprising a plurality of carrier fibres forming a core; a series of electronic devices mounted on the core with conductive interconnects extending along the core; a plurality of packing fibres around the core, the devices and the interconnects; and a retaining sleeve around the packing fibres, wherein the core, the devices and the interconnects are confined within the plurality of packing fibres retained in the sleeve. The interconnects can comprise at least one conductor that extends the length of the yarn. By mounting the devices and interconnects on carrier fibres they are more easily retained in the body of the yarn and within the packing fibres.

SUMMARY OF THE INVENTION

The present invention is also directed at the use of carriers bearing mounted electronic devices for use as a yarn or in yarns of the kind described in the Patent publications referred to above. Particularly it is directed at the manufacture of such yarns or filament fibres. According to the present invention electronic devices are mounted in sequence or series along a plurality of laterally spaced discrete lines on a sheet of non-conductive flexible planar support material; and the sheet is slit or stripped between said lines to create at least two yarns or filament fibres each in the form of a strip bearing a series of said devices. The width of each strip can be substantially the same as that of the mounted device or devices; normally less than twice that of the device or devices. Thus, with the thickness of the support material being normally no more than 10 μm, and with the width of the devices typically being no more than 800 μm, a strip bearing the devices can thus be used as a yarn or strip for use in many applications, both functional and decorative, either alone or within a sleeve.

The support material can be provided in the form of a continuous length which is drawn through a mounting station where the series of electronic devices are installed in discrete lines substantially parallel to the direction of passage of the material. The drawn material can then be rewound onto a roll for subsequent slitting or stripping, or passed directly to a cutting device in which it is divided into the strips. Lines of weakness may be formed between the lines of devices to facilitate subsequent slitting or stripping if the material is not to be slit or stripped directly after the electronic devices have been mounted. The support material will normally itself be drawn as a tape from a roll, but might be delivered from another source; for example, directly from its own manufacture.

Yarns or filament fibres in the form of strips made according to the invention can be supplemented with means such as buttons; buttonholes; hooks or eyes, for attaching it to another surface or body. Where there are a plurality of devices on the length of material, they will normally be mounted on the same side. This arrangement means that the opposite side can for example, bear an adhesive enabling the strip to be readily attached to another surface. In some embodiments, the planar material may be coated with a conductive material on its face opposite the face upon which the devices are mounted. Such a layer may itself be in the form of a separate sheet, strip or multiple strips. However, devices may of course be mounted on both sides of the material, and this can facilitate the mounting process when different forms of device are being used.

The planar support material used in the invention is thin (typically 2.0-7.0 μm thick), and preferred materials are polymer sheet or tape, typically polyester. Other options are polyamides, polyethylene, polyetheretherketone (PEEK), poly-oxydiphenylene-pyromellitimide (Kapton), Polybenzimidazole or aramid based materials. The material should have a high melting point, typically above 350° C., and have a high level of thermal and chemical stability. The reason for this is to ensure it can withstand the heat generated when interconnects are coupled to the electronic devices.

The strips with electronic devices mounted thereon made according to the invention can be used alone, or as the basis for a yarn or filament fibre in which the strip (bearing the devices) is enclosed in a sleeve. Such a yarn or fibre may be incorporated in a fabric. In one example, the strip may form the core in a yarn of the kind described in our International Application. In such an embodiment the packing fibres can be untwisted; i.e. extend generally parallel to the yarn axis, but may be selectively bunched or twisted to fill spaces between the devices. A separate filler material may also be used for this purpose. These options can serve to preserve a substantially uniform cross-section along the length of the yarn and between the devices. The packing fibres, and a filler material if used, may be selected to either encourage or discourage the absorption of moisture by the composite yarn.

The electronic devices incorporated in yarns embodying the invention can take many forms, including operative devices such as a silicon chip signaling devices; light, sound or symbol generators; micro-controllers and energy harvesting devices. Particularly suitable for use in yarns of the present invention are ultra thin electronic dice. The present invention is also suitable for radio frequency identification devices (RFIDs) with antennas extending along the length of material on both sides of the RFID chip. Such antennas, or interconnects coupled to the devices can be mounted on the material before the devices, such as by digital printing, and the devices then mounted thereover.

DESCRIPTION OF THE DRAWINGS

The invention will now be described by way of example and with reference to the accompanying schematic drawings wherein:

FIG. 5 shows a planar support material drawn from a roll through a mounting and cutting station in a method according to the invention; and FIG. 6 shows a variation of the method shown in FIG. 5 in which the support material bearing the devices is rewound on a second roll.

DETAILED DESCRIPTION

Electronically functional carriers, that is yarns or filaments, may be formed as described below.

Figure 1:
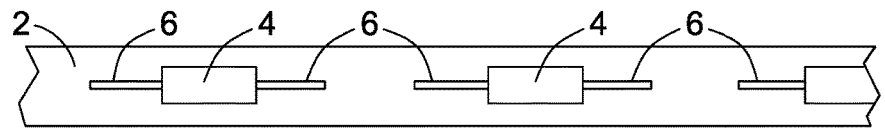
FIG. 1 is an enlarged plan view of a strip of planar material bearing electronic devices forming a yarn or filament fibre made according to the invention.

The length of non-conductive planar material shown in FIG. 1 takes the form of an endless strip or tape 2 which is typically of polyester but other materials can be used as noted herein. Mounted on the strip are electronic devices 4, each with conductive interconnects 6 extending therefrom in either direction along the strip 2. The devices are secured to the material by adhesive, and as is described below, the interconnects 6 are attached to the devices 4 between the devices and the material, and extend along the surface of the material. They will also normally be adhered to the material. The width of the strip will normally be as close as possible to that of the widest of the devices on the strip having regard to the eventual use of the strip, and is preferably no more than twice that of the widest device. For example, if the width of the widest device is 400 µm, the width of the tape or strip will be no more than 800 µm. The overall thickness of the strip where the device is mounted is preferably no greater than its width; in other words no greater than 800 µm. The strip can be used as a yarn or filament fibre alone or in fabrics for functional or decorative purposes.

Figure 2:
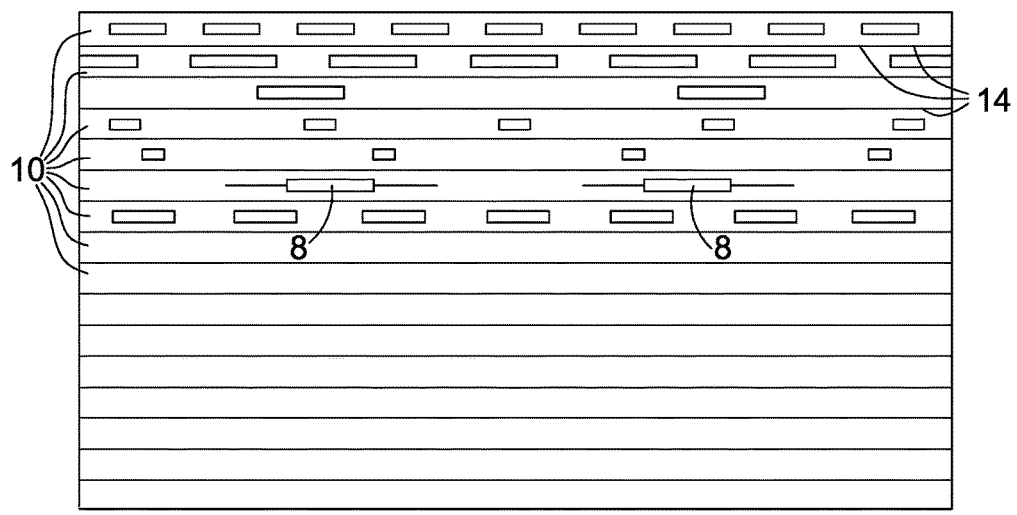
FIG. 2, also not to scale, is a plan view of a sheet of material bearing electronic devices according to the invention.

FIG. 2 illustrates how a plurality of strips of the kind shown in FIG. 1 can be created on a sheet of non-conductive planar material. A plurality of electronic devices are mounted on the sheet, arranged in lines 10. The devices need not be all the same; some (8) may have interconnects 12 attached; others may not, and the devices may be differently spaced along their respective lines. The sheet may also be formed with lines 14 of weakness to facilitate division of the sheet into strips of the kind shown in FIG. 1. Multiple strips can therefore be manufactured in a single process, and cut, stripped or torn therefrom for use as required. It will be understood that the sheet may itself be part of an endless length of material passing through a mounting station which is then cut to define the desired length of the strips, and divided or slit to create the strips themselves.

If desired, a strip of the kind described above can be supplemented with means for attaching it to another body or surface as part of the manufacturing or assembly process. Possibly most simply, when devices are mounted on one side of the planar material, a layer of adhesive can be applied to the other. The strip with the devices uppermost can then be easily secured on a surface for identification or ornamental purposes. Other forms of attachment, such as buttons; buttonholes; hooks, and eyes, can also be fitted to match complementary forms on the other body or surface. Such supplementation can be accomplished on separated strips or on a sheet or continuous length of the planar material before or after the devices are mounted thereon.

Figure 3:
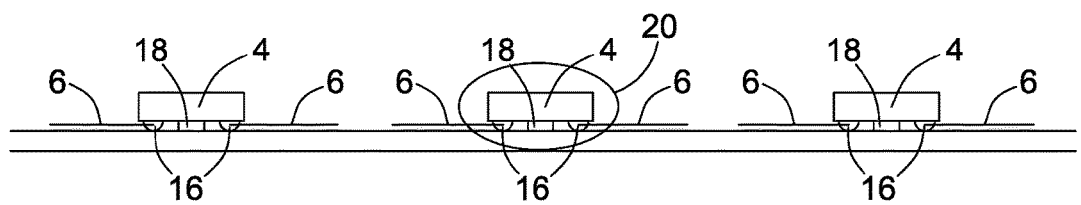
FIG. 3 illustrates a procedure for mounting electronic devices and conductive interconnects on a planar material in accordance with the invention.

FIG. 3 illustrates how each electronic 4 device with attached interconnects 6 may be mounted on the sheet in FIG. 2. The interconnects 6 are attached to each device 4 by solder pads 16, and a button 18 of adhesive is applied to each device between the solder pads 16. The device and interconnects are laid on the strip or sheet, and the adhesive either cured or allowed to cure to secure the position of the respective device. Adhesive will normally also be used to hold the interconnects in place. In a different procedure, the interconnects 6 can first be mounted on the strip or sheet, for example by digital printing and the devices 4 then located and held in place with sufficient heat and pressure to both cure the adhesive 18 and melt the solder 16 to complete the mount and the connection between the interconnects and the respective devices. This procedure does though, require the material of the strip or sheet to tolerate the applied heat and pressure. Polyester fulfils the requirements in this respect. Other suitable materials are polybenzimidazole or aramid based such as PBI, Vectran, Kapton or Normex. After mounting, each device 4, with its adjacent length of strip 2 and proximal ends of the interconnects 6, can be enclosed in a polymeric micro-pod 20 which then becomes part of the device defining its dimensions.

Figure 4:
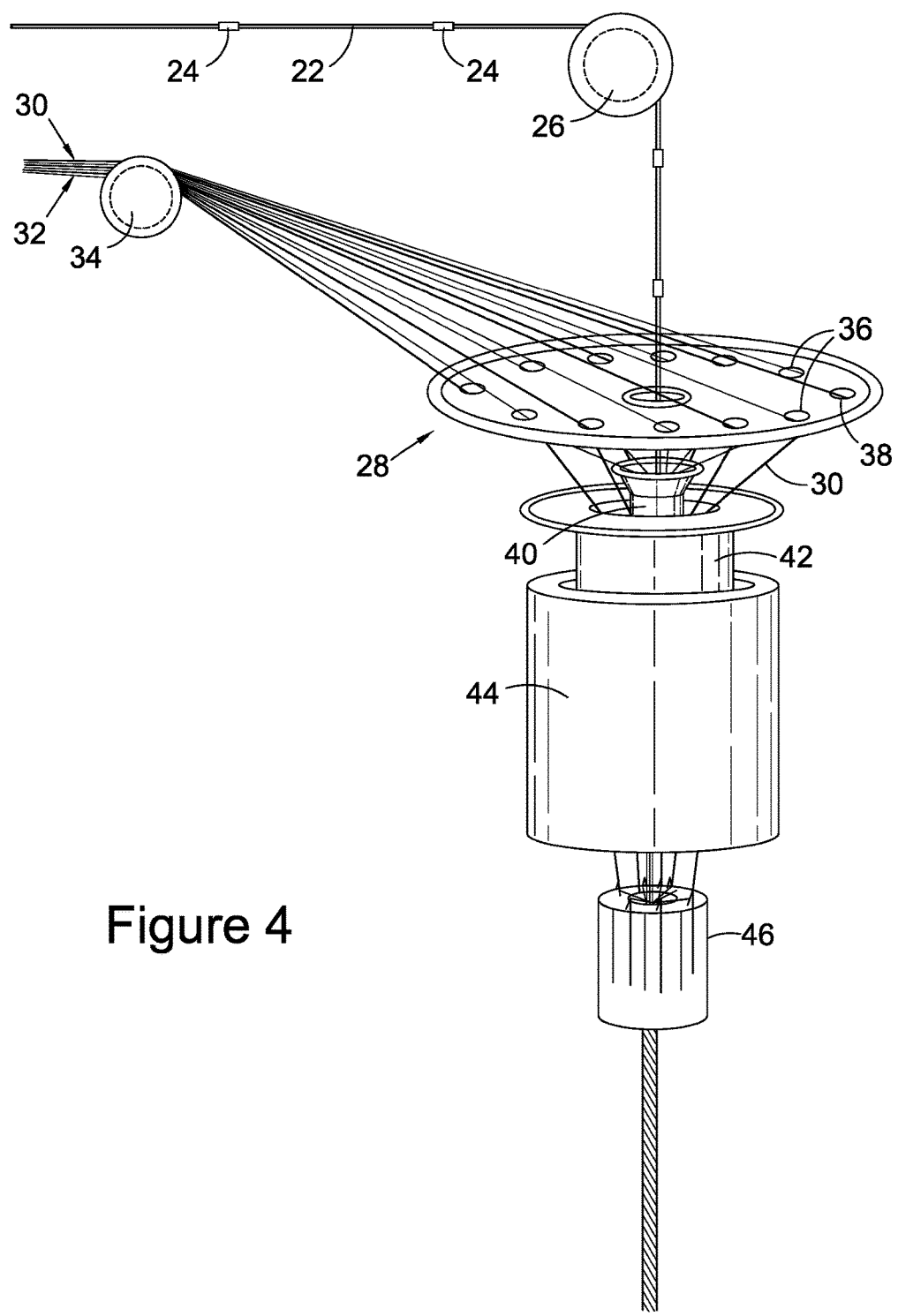
FIG. 4 illustrates a procedure for incorporating a strip in a composite yarn of the kind described in our International Application.

FIG. 4 illustrates a technique, similar to that described in our International Application, for enclosing a strip of the kind described above bearing electronic devices in a sleeve with packing fibres. A strip 22 carrying the devices 24; in their micro-pods and with their interconnects if used, is fed centrally around a first guide roller 26 to a central opening in a disc 28. Sleeve fibres 30 and packing fibres 32 are fed from respective second and third guide rollers 34 to alternate openings 36 and 38 around the periphery of the disc 28. From the disc 28 the packing fibres 32 are fed to a central duct 40 which also receives the strip 22 carrying the devices. The sleeve fibres 30 pass through a stationary yarn guide tube 42, and then though a rotatable cylindrical yarn guide 44 to a needle cylinder 46 where the fibres are interlooped to form the sleeve. The completed composite yarn is drawn from the needle cylinder 46 at a rate commensurate with the knitting process. Suitable materials for the packing fibres are polyester, polyaminde, polybenzimidazole or aramid based such as PBI, Vectran or Normex. The material of the sleeve fibres is normally textile based, and selected on the basis of the eventual intended use of the composite yarn.

The drawings show the mounted electronic devices quite closely spaced in their respective series or sequences on the support material. It will though, be appreciated that this spacing can of course be selected according to the intended ultimate use of the resulting strip or yarn. If the yarn is to be used in a fabric the distances between devices along the yarn can be quite large, and selected to locate respective devices in the fabric.

As noted above, devices that might be used in the practice of the invention typically have a width up to 800 μm, normally at least 100 μm. Some chips have a width of around 400 μm, but smaller dimensions are possible. Normally, the devices will be arranged in straight lines to facilitate slitting or otherwise dividing the sheet into strips, but it will be appreciated that shaped lines can easily be created and cut. One product of the process is a sheet bearing the arranged lines of devices as shown in FIG. 2. However the process can be adapted to mount devices on a continuous sheet or tape which can be cut and slit as required to produce multiple strips of whatever length is needed. Individual sheets can be manufactured in this way, but devices may be mounted on a continuous length of material; for example taken from a roll, and sections cut or stripped therefrom of whatever length is required for a particular purpose. This technique can be used to create individual strips, or multiple adjacent strips. Methods according to the invention for accomplishing this are illustrated in FIGS. 5 and 6.

FIG. 5 shows how the mounting of the electronic devices and interconnects can be mounted on planar support material 50 drawn from a roll 52. The material is drawn through a station 54 where the devices and interconnects are mounted in the manner described above with reference to FIG. 3. The material proceeds directly to a curing station 56, and then to a cutting device 58 where the material is slit into a plurality of strips 60, each bearing a series of electronic devices as described above. The station 54 can be operated to mount selected devices spaced along the respective lines according to the intended use of the resulting respective strips. In some circumstances this spacing can be substantial. It will be appreciated that the mounting and curing stations, and the cutting device can be computer driven, and thereby programmed to create yarns with the required devices and spacing in an efficient manufacturing process.

The cutting device may be replaced by a scoring device creating lines of weakness which results in the material leaving in the form of a tape which can be readily torn into strips. Each strip can then itself be used as a yarn or filament fibre for use in fabrics for example, in which the electronic devices can function, or lengths thereof can be used as attachments to products for identification or other purposes. They can also be used in the formation of a composite yarn of the kind described above with reference to FIG. 4. FIG. 6 shows a mounting procedure similar to that of FIG. 5, but with a scoring device 62 in place of the cutting device 58.

The scored material bearing the devices and interconnects is rewound onto a second roll 64 for storage and subsequent use. The scores create lines of weakness which enables individual strips to be torn from the material as required. The scoring device may of course be omitted in which case the material must be slit in a separate operation when required into strips for use as described above. In another option, strips slit or torn from the material can be separately wound onto individual rolls for their own storage and subsequent use.

The invention claimed is:

1. A method of manufacturing carriers, each having at least one filament fibre and a plurality of electronic devices, said method comprising the steps of mounting said devices in series along a plurality of laterally spaced discrete lines on a sheet of non-conductive flexible planar support material; stripping the sheet between said lines to create at least two carriers, each in the form of a strip bearing a series of said devices, the width of the strip being no more than twice that of one of the devices; feeding at least one strip bearing the devices centrally through a channel with packing fibres around the sides thereof to form a fibre assembly around the strip; feeding the fibre assembly into a sleeve forming unit in which a sleeve is formed around the assembly to form a composite yarn; and withdrawing the composite yarn from the sleeve forming unit.

2. The method according to claim 1 wherein the sheet of non-conductive flexible planar support material is in the form of a continuous length passing through a mounting station, and on which the series of the electronic devices are mounted in said lines substantially parallel to the direction of passage of the sheet of non-conductive flexible planar support material.

3. The method of claim 2 wherein the sheet of non-conductive flexible planar support material is drawn from a roll.

4. The method of claim 3 wherein the electronic devices are mounted on the sheet of non-conductive flexible planar support material prior to formation of said sheet into a roll.

5. The method of claim 1 wherein the sheet of non-conductive flexible planar support material is formed with lines of weakness between the lines of devices to facilitate stripping the sheet of non-conductive flexible planar support material therebetween.

6. The method of claim 1 wherein the devices are mounted on the sheet by means of adhesive.

7. The method of claim 1 wherein the devices include conductive interconnects connected thereto and oriented to extend along each strip in opposite directions from each device.

8. The method of claim 7 wherein the interconnects are mounted on the sheet of non-conductive flexible planar support material prior to mounting of the devices thereover.

9. The method of claim 8 wherein the interconnects are printed on a surface of the sheet of non-conductive flexible planar support material.

10. The method of claim 7 wherein the conductive interconnects are antennas.

11. The method according of claim 7 wherein the connection of the interconnects to each device is between the device and the sheet, of non-conductive flexible planar support material.

12. The method of claim 1 wherein the sheet of non-conductive flexible planar support material is made from a group consisting of polyester; polyetheretherketone (PEEK); and poly-oxydiphenylene-pyromellitimide (Kapton).

\* \* \* \* \*